United States Patent
Shen et al.

(10) Patent No.: US 9,685,571 B2
(45) Date of Patent: Jun. 20, 2017

(54) SOLAR CELL MODULE WITH HIGH ELECTRIC SUSCEPTIBILITY LAYER

(71) Applicant: SunPower Corporation, San Jose, CA (US)

(72) Inventors: Yu-Chen Shen, Sunnyvale, CA (US); Ernest Hasselbrink, Jr., Danville, CA (US); David F. J. Kavulak, Fremont, CA (US)

(73) Assignee: SunPower Corporation, San Jose, CA (US)

( * ) Notice: Subject to any disclaimer, the term of this patent is extended or adjusted under 35 U.S.C. 154(b) by 606 days.

(21) Appl. No.: 13/966,743

(22) Filed: Aug. 14, 2013

(65) Prior Publication Data

US 2015/0047690 A1    Feb. 19, 2015

(51) Int. Cl.
   *H01L 31/048*    (2014.01)

(52) U.S. Cl.
   CPC ........ *H01L 31/048* (2013.01); *H01L 31/0481* (2013.01); *Y02B 10/12* (2013.01); *Y02E 10/50* (2013.01)

(58) Field of Classification Search
   CPC ....... H01L 31/02167; H01L 31/022425; H01L 31/046; H01L 31/048; H01L 31/068; H01L 31/48; H01L 31/0481; Y02B 10/12
   USPC ......................................................... 136/251
   See application file for complete search history.

(56) References Cited

U.S. PATENT DOCUMENTS

| | | | |
|---|---|---|---|
| 3,961,997 A | 6/1976 | Swanson et al. | |
| 4,070,097 A | 1/1978 | Gelber et al. | |
| 4,084,099 A | 4/1978 | Harvey et al. | |
| 4,278,831 A | 7/1981 | Riemer et al. | |
| 4,427,839 A | 1/1984 | Hall | |
| 4,478,879 A | 10/1984 | Baraona et al. | |
| 4,496,788 A | 1/1985 | Hamakawa et al. | |
| 4,509,248 A | 4/1985 | Spitzer et al. | |
| 4,665,277 A | 5/1987 | Sah et al. | |
| 4,927,770 A | 5/1990 | Swanson | |
| 5,030,295 A | 7/1991 | Swanson et al. | |
| 5,053,083 A | 10/1991 | Sinton | |
| 5,057,439 A | 10/1991 | Swanson et al. | |
| 5,066,340 A | 11/1991 | Iwamoto et al. | |
| 5,164,019 A | 11/1992 | Sinton | |
| 5,213,628 A | 5/1993 | Noguchi et al. | |

(Continued)

OTHER PUBLICATIONS

PCT International Search Report and Written Opinion of the International Searching Authority for Application No. PCT/US2014/049964, Nov. 18, 2014 [Nov. 18, 2014], 5 sheets.

(Continued)

*Primary Examiner* — Devina Pillay

(74) *Attorney, Agent, or Firm* — Okamoto & Benedicto LLP

(57) ABSTRACT

A solar cell module includes solar cells that are encased in a protective package and a high electric susceptibility layer that is placed on the solar cells. The high electric susceptibility layer is polarized such that a sheet charge is developed at the interface of the high electric susceptibility layer and the solar cells. The protective package includes an encapsulant that encapsulates the solar cells. The encapsulant may be a multilayer encapsulant, with the high electric susceptibility layer being a layer of the encapsulant. The high electric susceptibility layer may also be a material that is separate from the encapsulant.

20 Claims, 5 Drawing Sheets

(56) References Cited

U.S. PATENT DOCUMENTS

| | | |
|---|---|---|
| 5,217,539 A | 6/1993 | Fraas et al. |
| 5,266,125 A | 11/1993 | Rand et al. |
| 5,360,990 A | 11/1994 | Swanson |
| 5,369,291 A | 11/1994 | Swanson |
| 5,391,235 A | 2/1995 | Inoue |
| 5,447,576 A | 9/1995 | Willis |
| 5,468,652 A | 11/1995 | Gee |
| 5,512,757 A | 4/1996 | Cederstrand et al. |
| 5,641,362 A | 6/1997 | Meier |
| 5,660,646 A | 8/1997 | Kataoka et al. |
| 5,728,230 A | 3/1998 | Komori et al. |
| 5,918,140 A | 6/1999 | Wickboldt et al. |
| 6,013,582 A | 1/2000 | Ionov et al. |
| 6,096,968 A | 8/2000 | Schlosser et al. |
| 6,118,258 A | 9/2000 | Farine et al. |
| 6,130,379 A | 10/2000 | Shiotsuka et al. |
| 6,143,976 A | 11/2000 | Endros |
| 6,147,297 A | 11/2000 | Wettling et al. |
| 6,210,991 B1 | 4/2001 | Wenham et al. |
| 6,262,359 B1 | 7/2001 | Meier et al. |
| 6,274,402 B1 | 8/2001 | Verlinden et al. |
| 6,274,404 B1 | 8/2001 | Hirasawa et al. |
| 6,278,054 B1 | 8/2001 | Ho et al. |
| 6,311,436 B1 | 11/2001 | Mimura et al. |
| 6,313,395 B1 | 11/2001 | Crane et al. |
| 6,333,457 B1 | 12/2001 | Mulligan et al. |
| 6,337,283 B1 | 1/2002 | Verlinden et al. |
| 6,387,726 B1 | 5/2002 | Verlinden et al. |
| 6,423,568 B1 | 7/2002 | Verlinden et al. |
| 6,429,037 B1 | 8/2002 | Wenham et al. |
| 6,465,724 B1 | 10/2002 | Garvison et al. |
| 6,524,880 B2 | 2/2003 | Moon et al. |
| 6,552,414 B1 | 4/2003 | Horzel et al. |
| 6,692,985 B2 | 2/2004 | Huang et al. |
| 6,762,508 B1 * | 7/2004 | Kiso ............... B32B 17/04 136/251 |
| 6,777,610 B2 | 8/2004 | Yamada et al. |
| 6,872,321 B2 | 3/2005 | Thavarajah et al. |
| 6,998,288 B1 | 2/2006 | Smith et al. |
| 7,135,350 B1 | 11/2006 | Smith et al. |
| 7,217,883 B2 | 5/2007 | Munzer |
| 7,238,594 B2 | 7/2007 | Fonash et al. |
| 7,280,235 B2 | 10/2007 | Lapstun et al. |
| 7,281,786 B2 | 10/2007 | Silverbrook |
| 7,292,368 B2 | 11/2007 | Rozzi |
| 7,306,307 B2 | 12/2007 | Lapstun et al. |
| 7,306,325 B2 | 12/2007 | Silverbrook et al. |
| 7,309,020 B2 | 12/2007 | Anderson et al. |
| 7,322,669 B2 | 1/2008 | Berry et al. |
| 7,322,673 B2 | 1/2008 | Silverbrook et al. |
| 7,328,966 B2 | 2/2008 | Silverbrook |
| 7,335,555 B2 | 2/2008 | Gee et al. |
| 7,341,328 B2 | 3/2008 | Berry et al. |
| 7,357,476 B2 | 4/2008 | Berry et al. |
| 7,468,485 B1 | 12/2008 | Swanson |
| 7,517,709 B1 | 4/2009 | Borden et al. |
| 7,554,031 B2 | 6/2009 | Swanson et al. |
| 7,633,006 B1 | 12/2009 | Swanson |
| 7,786,375 B2 | 8/2010 | Swanson et al. |
| 2002/0020440 A1 | 2/2002 | Yoshimine et al. |
| 2003/0070707 A1 | 4/2003 | King et al. |
| 2003/0076649 A1 | 4/2003 | Speakman |
| 2003/0134469 A1 | 7/2003 | Horzel et al. |
| 2003/0178056 A1 | 9/2003 | Hikosaka et al. |
| 2004/0200520 A1 | 10/2004 | Mulligan et al. |
| 2004/0261840 A1 | 12/2004 | Schmit et al. |
| 2005/0016578 A1 | 1/2005 | Enomoto et al. |
| 2005/0051204 A1 | 3/2005 | Oi et al. |
| 2005/0178428 A1 | 8/2005 | Laaly et al. |
| 2005/0268963 A1 | 12/2005 | Jordan et al. |
| 2006/0130891 A1 | 6/2006 | Carlson |
| 2006/0157103 A1 | 7/2006 | Sheats et al. |
| 2006/0196535 A1 | 9/2006 | Swanson et al. |
| 2006/0201545 A1 | 9/2006 | Ovshinsky et al. |
| 2007/0082206 A1 | 4/2007 | Hartig |
| 2007/0151598 A1 | 7/2007 | De Ceuster et al. |
| 2007/0269750 A1 | 11/2007 | Irving et al. |
| 2008/0178929 A1 | 7/2008 | Skov et al. |
| 2008/0199690 A1 | 8/2008 | Hayes et al. |
| 2008/0223433 A1 | 9/2008 | Hanoaka et al. |
| 2009/0205712 A1 | 8/2009 | Cousins |
| 2010/0012172 A1 | 1/2010 | Meakin et al. |
| 2010/0047589 A1 | 2/2010 | Ochs et al. |
| 2010/0075234 A1 | 3/2010 | Cousins |
| 2010/0108128 A1 | 5/2010 | Chu et al. |
| 2010/0139740 A1 | 6/2010 | Xavier et al. |
| 2010/0139764 A1 | 6/2010 | Smith |
| 2010/0175743 A1 | 7/2010 | Gonzalez et al. |
| 2010/0307562 A1 * | 12/2010 | Swanson ........... H01L 31/02167 136/244 |
| 2011/0036390 A1 | 2/2011 | Nelson et al. |
| 2011/0048506 A1 | 3/2011 | Pichler |
| 2011/0139224 A1 | 6/2011 | Krajewski |
| 2011/0147891 A1 | 6/2011 | Furukawa et al. |
| 2011/0308602 A1 | 12/2011 | Junghanel et al. |
| 2012/0272721 A1 | 11/2012 | Kochupurackal et al. |

OTHER PUBLICATIONS

SunPower Discovers the "Surface Polarization" Effect in High Efficiency Solar Cells, Aug. 2005, pp. 1-4, Source: SunTechnics SunReader.

R. Swanson, et al., "The Surface Polarization Effect in High-Effiency Silicon Solar Cells", submitted for publication to the 15th International Photovoltaic Science and Engineering Conference & Solar Energy Exhibition, Oct. 10-15, 2005 (4 sheets), Shanghai, China.

Jianhua Zhao, et al., "Performance Instability in N-Type Pert Silicon Solar Cells", The 3rd World Conference on Photovoltaic Energy Conversion, May 12-16, 2003 (4 sheets), Osaka, Japan.

S.M. Sze "Physics of Semiconductor Devices", 1981 Second Edition, pp. 362-369, Copyright by John Wiley & Sons, Inc., U.S.

W.P. Mulligan, et al. "A Flat-Plate Concentrator: Micro-Concentrator Design Overview", 2000, 3 sheets, Proceedings of the 28th IEEE PVSC.

K. R. McIntosh, et al. "The Choice of Silicon Wafer for the Production of Low-Cost Rear-Contact Solar Cells", May 2003, 4 sheets, Sunpower Corporation, Sunnyvale, CA.

P.J. Verlinden, et al. "Will We have a 20%-Efficient(PTC) Photovoltaic System?", 2001, 6 sheets, Proceedings of the 17th Europe Photovoltaic Solar Energy Conference.

William P. Mulligan, et al. "Development of Chip-Size Silicon Solar Cells", 2000, 6 sheets, Proceedings of the 28th IEEE PVSC.

Akira Terao, et al. "A Mirror-Less Design for Micro-Concentrator Modules", 2000, 4 sheets, Proceedings of the 28th IEEE PVSC.

P.J. Verlinden, et al. "Backside-Contact Silicon Solar Cells with Improved Efficiency for the '96 World Solar Challenge", 1997, 5 sheets, Proceedings of the 15th EPSEC.

P.J. Verlinden, et al. "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson, "The Promise of Concentrators", 2000, Prog. Photovolt. Res. Appl. 8, pp. 93-111 (2000), Sunpower Corporation, Sunnyvale, CA.

Ronald A. Sinton, et al. "Simplified Backside-Contact Solar Cells", Feb. 1990, pp. 348-352, IEEE Transactions on Electron Devices, vol. 37. No. 2.

Ronald A. Sinton, "Device Physics and Characterization of Silicon Point-Contact Solar Cells", Feb. 1997, pp. 1-154, Stanford Electronics Laboratories, Stanford University, CA.

Richard Roland King, "Studies of Oxide-Passivated Emitters in Silicon and Applications to Solar Cells", Aug. 1990, pp. 1-200, (Thesis) Electrical Engineering Department of Stanford University, CA.

Eric Fogarassy, et al. "Long-Pulse Excimer Laser Crystallization and Doping for the Fabrication of High Performance Polysilicon TFTs", Jan. 2006, pp. S40-S46, Journal of the Korean Physical Society, vol. 48.

(56) References Cited

OTHER PUBLICATIONS

Ted Kamins, "Polycrystalline Silicon for Integrated Circuit Applications" third printing 1994, pp. 198-199, Kluwer Academic Publishers, Norwell, Massachusetts.
J.Y. Lee, et al. "Boron-Back Surface Field With Spin-On Dopants by Rapid Thermal Processing", Jun. 2004, pp. 998-1001, 19th European Photovoltaic Solar Energy Conference, Paris, France.
B. Lee et al. "Thermally conductive and electrically insulating EVA composite encapsulants for solar photovoltaic (PV) cell", 2008, pp. 357-363, exPRESS Polymer Letters vol. 2, No. 5.
John Pern "Module Encapsulation Materials, Processing and Testing", 2008, 33 pages, NREL National Renewable Energy Laboratory.
DuPont, DuPont PV5300 Series Photovoltaic Encapsulant Sheets Based on DuPont SentryGlass, Apr. 2009, 3 sheets.

* cited by examiner

SOLAR CELL MODULE WITH HIGH ELECTRIC SUSCEPTIBILITY LAYER

TECHNICAL FIELD

Embodiments of the subject matter described herein relate generally to solar cells, and more particularly to solar cell modules.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load.

Several solar cells may be connected together to form a solar cell array. The solar cell array may be packaged into a solar cell module, which includes protection layers that allow the solar cell array to withstand environmental conditions in the field. Embodiments of the present disclosure pertain to solutions for increasing efficiency and addressing surface degradation mechanisms of solar cells in solar cell modules.

BRIEF SUMMARY

In one embodiment, a solar cell module includes solar cells that are encased in a protective package and a high electric susceptibility layer that is placed on the solar cells. The high electric susceptibility layer is polarized such that a sheet charge is developed at the interface of the high electric susceptibility layer and the solar cells. The protective package includes an encapsulant that encapsulates the solar cells. The encapsulant may be a multilayer encapsulant, with the high electric susceptibility layer being a layer of the encapsulant. The high electric susceptibility layer may also be a material that is separate from the encapsulant.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of apparatus, components, and methods, to provide a thorough understanding of embodiments. Persons of ordinary skill in the art will recognize, however, that the embodiments can be practiced without one or more of the specific details. In other instances, well-known details are not shown or described to avoid obscuring aspects of the disclosure.

Figure 1:
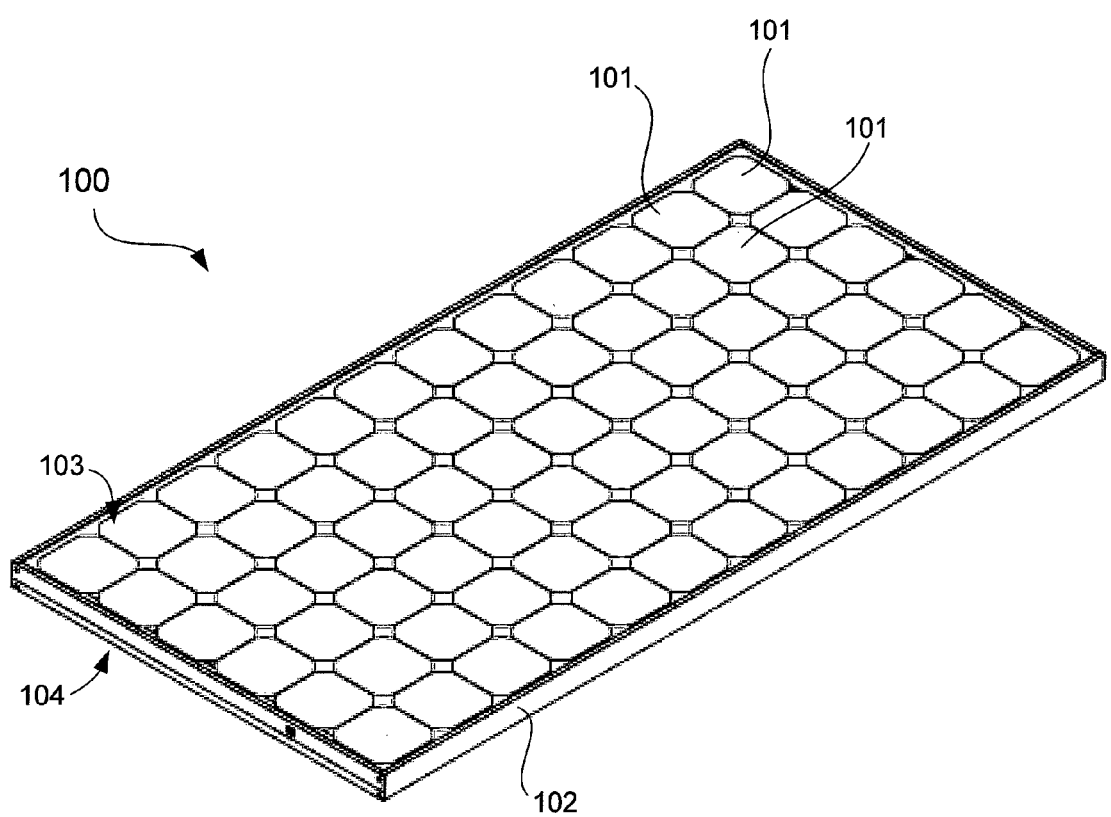
FIG. 1 shows a solar cell module in accordance with an embodiment of the present disclosure.

FIG. 1 shows a solar cell module 100 in accordance with an embodiment of the present disclosure. The solar cell module 100 is a so-called "terrestrial solar cell module" in that it is designed for use in stationary applications, such as on rooftops or by power generating stations. In the example of FIG. 1, the solar cell module 100 includes an array of interconnected solar cells 101. Only some of the solar cells 101 are labeled in FIG. 1 for clarity of illustration. Visible in FIG. 1 are the front sides of the solar cells 101, which are directed toward the sun during normal operation to collect solar radiation. The backsides of the solar cells 101 are opposite the front sides. A frame 102 provides mechanical support for the solar cell array.

In the example of FIG. 1, the solar cells 101 comprise all back contact solar cells, which are susceptible to front surface degradation mechanisms, such as potential induced degradation (e.g., high voltage degradation, cell polarization) and degradation due to exposure to ultraviolet radiation. In an all back contact solar cell, the P-type and N-type diffusion regions of the solar cell and the metal contacts to the P-type and N-type diffusion regions are all on the backside of the solar cell. In other embodiments, the solar cells 101 comprise front contact solar cells. In a front contact solar cell, diffusion regions of one polarity (e.g., N-type diffusion regions) are on the front side of the solar cell, and diffusion regions of the opposite polarity (e.g., P-type diffusion regions) are on the backside of the solar cell.

The front portion 103 of the solar cell module 100 is on the same side as the front sides of the solar cells 101 and is visible in FIG. 1. The back portion 104 of the solar cell module 100 is under the front portion 103. As will be more apparent below, the front portion 103 includes layers of protective materials that are formed on the front sides of the solar cells 101.

Figure 2:
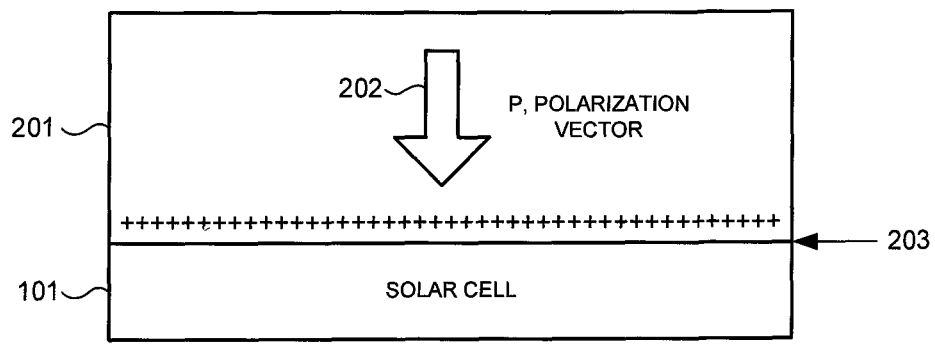
FIGS. 2 and 3 show schematic diagrams of a high electric susceptibility layer on a front surface of a solar cell in accordance with embodiments of the present disclosure.

FIG. 2 shows a schematic diagram of a high electric susceptibility layer 201 on a front surface of a solar cell 101 in accordance with an embodiment of the present disclosure. Generally speaking, electric susceptibility is a dimensionless proportionality constant that indicates the degree of polarization of a dielectric material in response to an applied electric field. More particularly, electric susceptibility $\chi_e$ is a constant of proportionality relating an electric field E to the induced dielectric polarization density P such that:

$$P = \epsilon_0 \chi_e E \quad \text{(EQ. 1)}$$

where P is the polarization density, $\epsilon_0$ is the electric permittivity of free space, $\chi_e$ is the electric susceptibility, and E is the electric field.

The layer 201 has "high electric susceptibility" in that it comprises a material with high enough electric susceptibility (e.g., at least 100) to allow the high electric susceptibility layer 201 to be polarized, as in a capacitor, and induce a sheet charge at its surface when placed in an electric field.

When the high electric susceptibility layer 201 is placed near a surface of a solar cell, the sheet charge induced by the electric field may be used to repel or attract charge carriers to reduce degradation, to increase the efficiency of the solar cell, etc.

In one embodiment, the solar cell 101 comprises an N-type silicon substrate. Because the bulk silicon of the solar cell 101 is N-type, the majority charge carriers in the solar cell 101 are electrons. The high electric susceptibility layer 201 may be polarized with a polarization vector 202 pointed toward the front surface of the solar cell 101 as shown in FIG. 2. This results in a positive sheet charge on the surface of the high electric susceptibility layer 201 that faces the solar cell 101, particularly at the interface 203. The positive sheet charge adds to the potential that repels the hole minority charge carriers at the interface 203, thereby reducing surface recombination to retard surface degradation and to increase solar cell efficiency.

Figure 3:
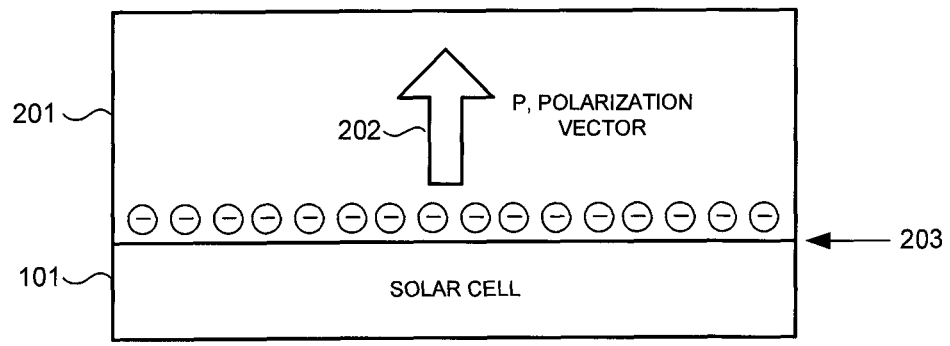

As shown in FIG. 3, the high electric susceptibility layer 201 may also be polarized with a polarization vector 202 pointed away from the front surface of the solar cell 101. This results in a negative sheet charge on the surface of the high electric susceptibility layer 201 that faces the solar cell 101, particularly at the interface 203. A negative sheet charge may be beneficial for reducing surface recombination in a solar cell 101 where the majority charge carriers are holes, as in embodiments where the solar cell 101 has a P-type silicon substrate. In those embodiments, the electron minority charge carriers at the interface 203 are advantageously repelled by the negative sheet charge.

Depending on the configuration of the solar cell 101, a particular sheet charge polarity at the interface 203 of the high electric susceptibility layer 201 and the solar cell 101 may exacerbate particular front surface degradations. For example, when the sheet charge induced at the interface 203 is negative and the majority charge carriers in the solar cell 101 are electrons, the negative sheet charge may attract hole minority charge carriers toward the high electric susceptibility layer 201, thereby accelerating degradation due to cell polarization. To minimize cell polarization, the high electric susceptibility layer 201 may have a "high resistivity," such as an electrical resistivity of at least $1\times10^{14}$ Ohm-cm to prevent or minimize leakage current through the high electric susceptibility layer 201. More particularly, in one embodiment, the high electric susceptibility layer 201 may have an electrical resistivity of at least $1\times10^{14}$ Ohm-cm and an electric susceptibility of at least 100.

The high electric susceptibility layer 201 may comprise a polymer, such as polyethylene or polyolefin. In one embodiment, to polarize the polymer, the polymer is exposed to an electric field that is applied at temperatures high enough to orient dipoles of the polymer. The temperature is then lowered in an amount of time that is shorter than the relaxation time to freeze-in the dipoles. The polarization of the polymer may be done either during lamination or during the extrusion process of encapsulant films. Additives may also be used in the formulation of the polymer to increase the electric susceptibility and relaxation time at standard operating temperatures of the solar cell module 100. Organic additives, such as camphoric imide or camphoric anhydride, may be used to double the dielectric properties of amorphous polymer matrixes without substantially affecting critical properties, such as electrical resistivity and optical transparency.

Figure 4:
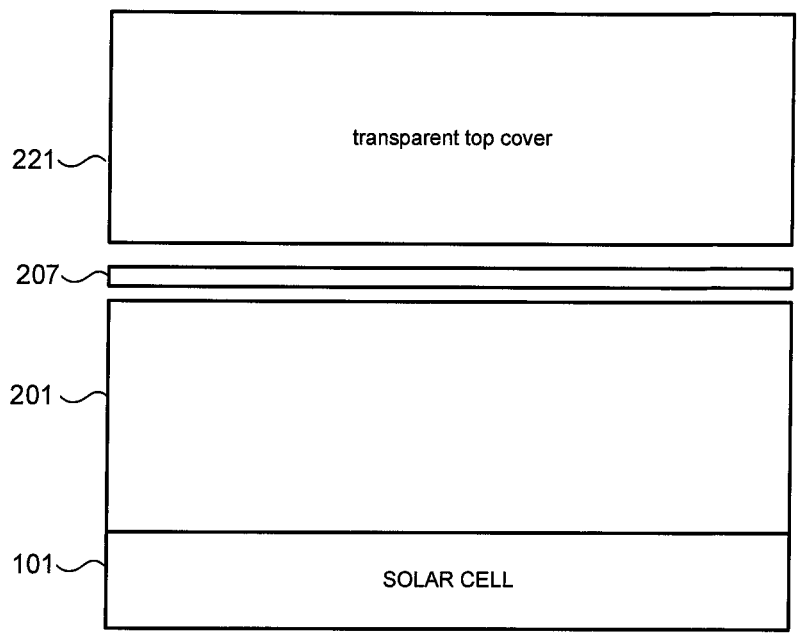
FIG. 4 shows a high electric susceptibility layer that is being polarized using a conductive material in accordance with an embodiment of the present disclosure.

The high electric susceptibility layer 201 may also be polarized by placing the high electric susceptibility layer 201 adjacent to a material that facilitates exposure of the susceptibility layer 201 to an electric field. For example, as shown in FIG. 4, a sheet of electrically conductive material 207 (e.g., indium tin oxide; high electrical conductivity encapsulant) may be placed between the high electric susceptibility layer 201 and a transparent top cover 221. An electrical lead may be attached to the electrically conductive material 207 for faster polarization of the high susceptibility layer 201.

Figure 5:
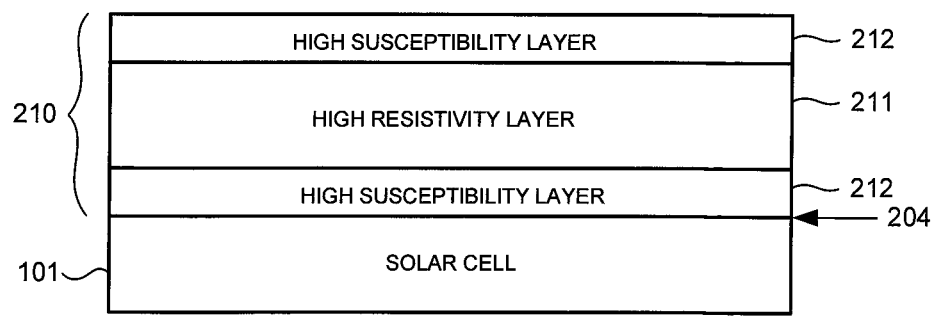
FIG. 5 shows a multilayer encapsulant with a high electric susceptibility layer in accordance with an embodiment of the present disclosure.

A high electric susceptibility layer 201 may be incorporated in the solar cell module 100 as an encapsulant or a separate layer of material. In the example of FIG. 5, an encapsulant 210 is a multilayer encapsulant having high electric susceptibility layers 212 and a high resistivity layer 211. Depending on the process of fabricating the encapsulant 210, the encapsulant 210 may only have a bottom high electric susceptibility layer 212 placed on the front surface of the solar cell 101; the encapsulant 210 has no top high electric susceptibility layer 212 in that embodiment.

The encapsulant 210 may comprise a polymer, such as polyethylene or polyolefin, with high electrical resistivity. The top and bottom portions of the encapsulant 210 may be doped with additives to increase their electric susceptibility, while leaving the bulk of the encapsulant 210 free of the additives. The doped top and bottom portions of the encapsulant 210 form the high electric susceptibility layers 212 and the undoped bulk of the encapsulant 210 forms the high resistivity layer 211. The bottom high electric susceptibility layer 212, i.e., the layer that interfaces with the solar cell 101, is polarized to induce a sheet charge at the interface 204 of the encapsulant 210 and the solar cell 101. The high electric susceptibility layer 212 may be polarized to induce the sheet charge (e.g., positive sheet charge) during extrusion of the encapsulant 210, for example.

Figure 6:
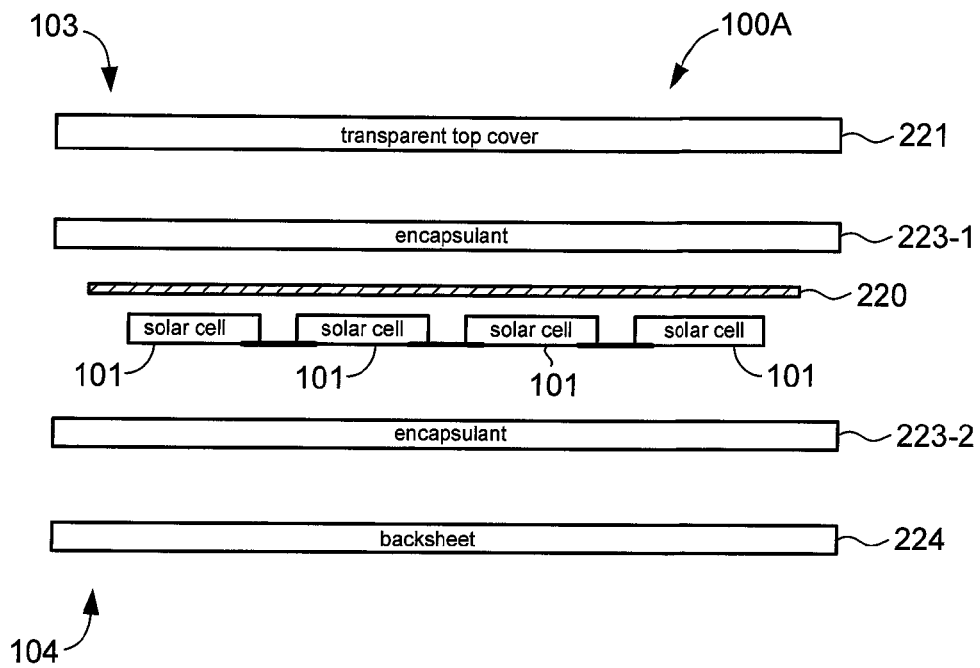
FIGS. 6-8 are cross-sectional views schematically illustrating fabrication of a solar cell module in accordance with an embodiment of the present disclosure.
Figure 7:
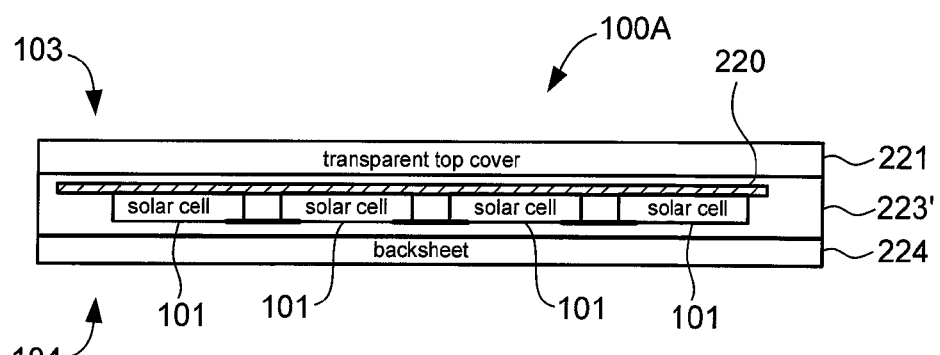
Figure 8:
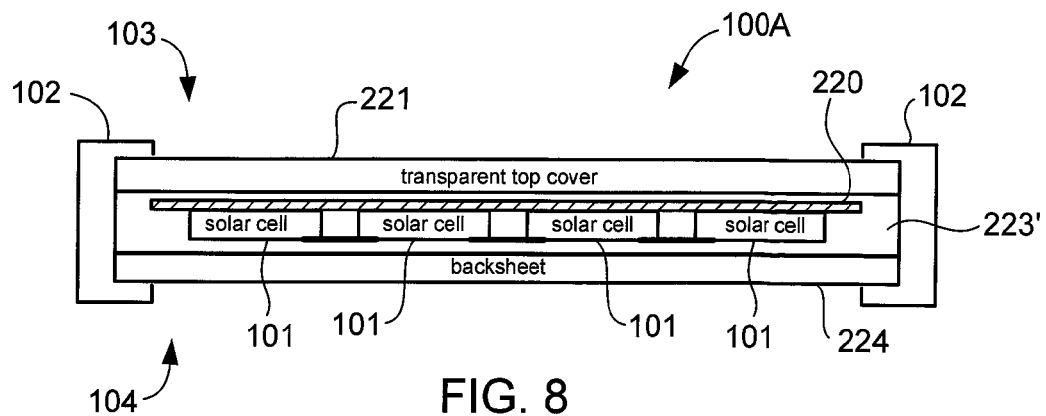

FIGS. 6-8 are cross-sectional views schematically illustrating fabrication of a solar cell module 100A in accordance with an embodiment of the present disclosure. The solar cell module 100A is a particular embodiment of the solar cell module 100 of FIG. 1.

FIG. 6 is an exploded view showing the components of the solar cell module 100A in accordance with an embodiment of the present disclosure. The solar cell module 100A may comprise a transparent top cover 221, an encapsulant 223-1, a high electric susceptibility layer 220, serially connected solar cells 101, an encapsulant 223-2, and a backsheet 224. In one embodiment, the encapsulants 223-1 and 223-2 are separate sheets of the same type of encapsulant.

The transparent top cover 221, which is the topmost layer on the front portion 103, protects the solar cells 101 from the environment. The solar cell module 100A is installed in the field such that the transparent top cover 221 faces the sun during normal operation. The front sides of the solar cells 101 face toward the sun by way of the transparent top cover 221. The transparent top cover 201 may comprise glass.

The encapsulants 223 (i.e., 223-1, 223-2) may comprise poly-ethyl-vinyl acetate ("EVA"), polyolefin, polyethylene, or other encapsulant material suitable for solar cell modules. The backsheet 224 may comprise Tedlar/Polyester/EVA ("TPE"), Tedlar/Polyester/Tedlar ("TPT"), or a multilayer backsheet comprising a fluoropolymer, to name some examples.

In the example of FIG. 6, a separate high electric susceptibility layer 220 is placed between the encapsulant 223-1 and the front sides of the solar cells 101. The high electric susceptibility layer 220 may have an electric susceptibility of at least 100 and, in some embodiments, an electrical resistivity of at least $1\times10^{14}$ Ohm-cm. The high electric susceptibility layer 220 does not necessarily have a high electrical resistivity, especially in embodiments where the encapsulant 223-1 has a high electrical resistivity or where leakage current from the front surfaces of the solar cells 101 to the transparent cover 221 does not result in significant front surface degradation.

In FIG. 7, the transparent top cover 221, the encapsulant 223-1, the high electric susceptibility layer 220, the encapsulant 223-2, and the backsheet 224 are formed together to create a protective package that encases the solar cells 101. In some embodiments, the aforementioned components may be formed together in the stacking order of FIG. 6. More particularly, the solar cells 101 are placed between the encapsulants 223-1 and 223-2, with the high electric susceptibility layer 220 between the encapsulant 223-1 and the front surfaces of the solar cells 101. The backsheet 224 is placed under the encapsulant 223-2, and the transparent top cover 221 is placed directly on the encapsulant 223-1. These components of the solar cell module 100A are then pressed and heated together by vacuum lamination, for example. The lamination process melts the encapsulants 223-1 and 223-2 together to encapsulate the solar cells 101 and the high electric susceptibility layer 220. In FIG. 7, the encapsulants 223-1 and 223-2 are labeled as 223' to indicate that that they have been melted together. The high electric susceptibility layer 220 may be polarized to induce a sheet charge (e.g., positive or negative sheet charge) at the interface of the high electric susceptibility layer 220 and the solar cells 101 during the lamination process, for example. FIG. 8 shows the protective package of FIG. 7 mounted on the frame 102.

Figure 9:
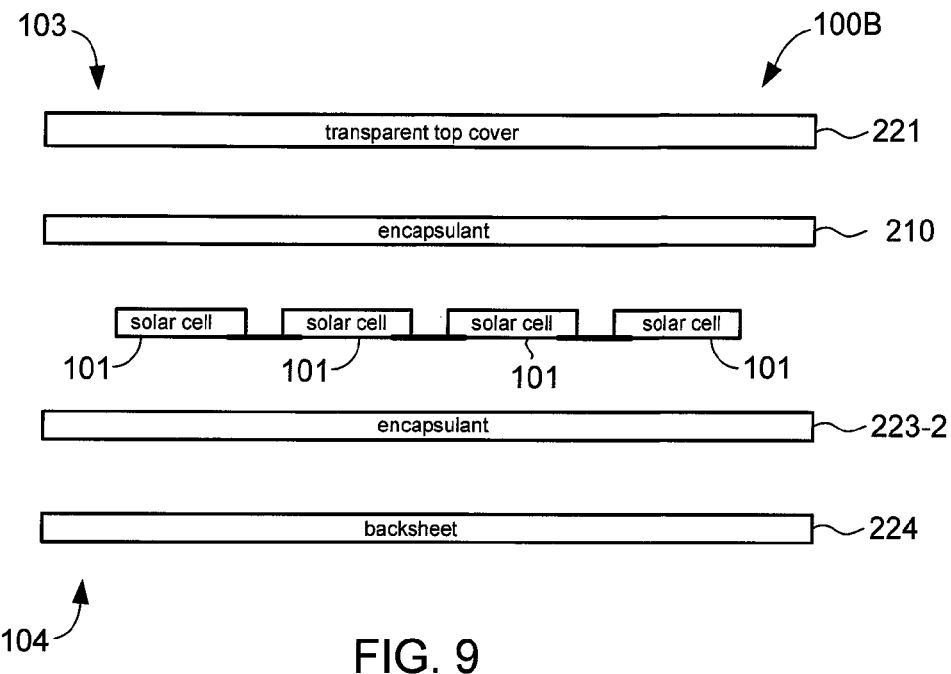
FIGS. 9-11 are cross-sectional views schematically illustrating fabrication of a solar cell module in accordance with another embodiment of the present disclosure.
Figure 10:
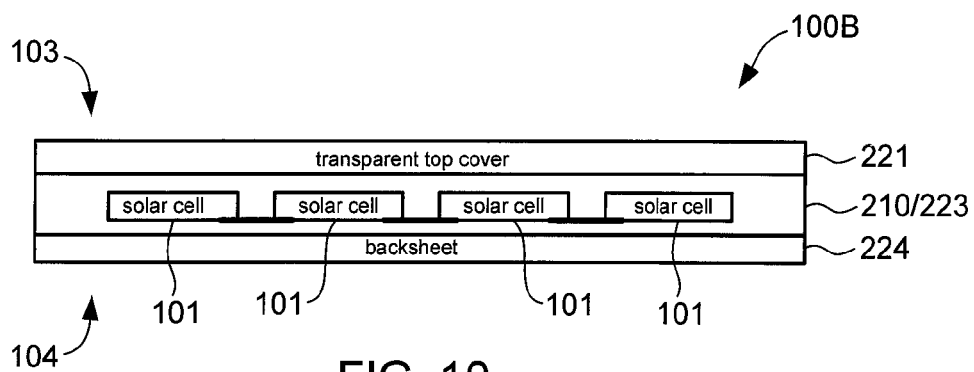
Figure 11:
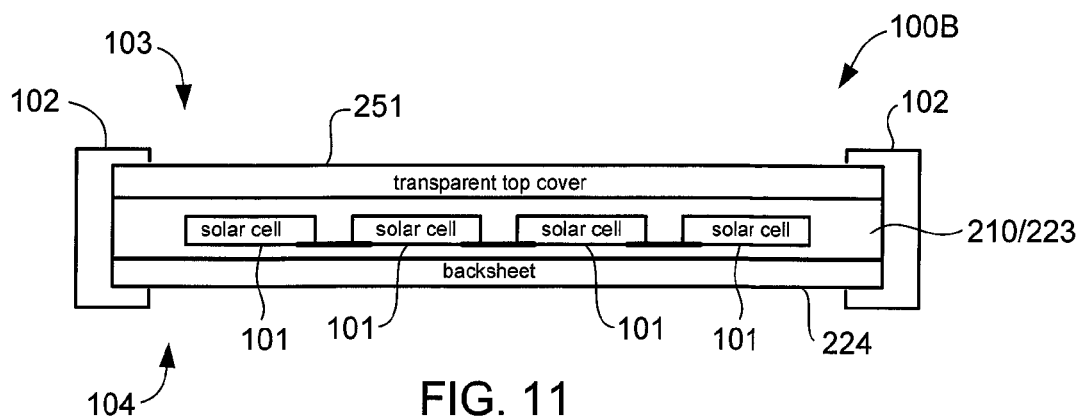

FIGS. 9-11 are cross-sectional views schematically illustrating fabrication of a solar cell module 100B in accordance with another embodiment of the present disclosure. The solar cell module 100B is a particular embodiment of the solar cell module 100 of FIG. 1.

FIG. 9 is an exploded view showing the components of the solar cell module 100B in accordance with an embodiment of the present disclosure. The solar cell module 100B may comprise the transparent top cover 221, the encapsulant 210, the serially connected solar cells 101, the encapsulant 223-2, and the backsheet 224. The solar cell module 100B differs from the solar cell module 100A in that a separate high electric susceptibility layer 220 is not employed. Instead, the encapsulant 210 replaces the encapsulant 223-1 to provide a high electric susceptibility layer as previously described with reference to FIG. 5 (see FIG. 5, high electric susceptibility layer 212 of encapsulant 210).

In FIG. 10, the transparent top cover 221, the encapsulant 210, the encapsulant 223-2, and the backsheet 224 are formed together to create a protective package that encases the solar cells 101. The aforementioned components may be formed together in the stacking order of FIG. 9 by pressing and heating them together in a vacuum lamination process, for example. The lamination process melts the encapsulant 210 and the encapsulant 223-2 together to encapsulate the solar cells 101. In FIG. 10, the encapsulants 210 and 223-2 are labeled together as 210/223 to indicate that they have been melted together. FIG. 11 shows the protective package of FIG. 10 mounted on the frame 102.

Solar cell modules with high electric susceptibility layers have been disclosed. While specific embodiments have been provided, it is to be understood that these embodiments are for illustration purposes and not limiting. Many additional embodiments will be apparent to persons of ordinary skill in the art reading this disclosure.

What is claimed is:

1. A solar cell module comprising:
   a plurality of solar cells, the plurality of solar cells having front sides facing the sun during normal operation and backsides opposite the front sides;
   a high electric susceptibility layer on the front sides of the plurality of solar cells, the high electric susceptibility layer having an electric susceptibility of at least 100;
   an encapsulant encapsulating the plurality of solar cells; and
   a transparent top cover on the high electric susceptibility layer.

2. The solar cell module of claim 1 wherein the encapsulant is a multilayer encapsulant and the high electric susceptibility layer is a layer of the encapsulant that is between the front sides of the solar cells and another layer of the encapsulant.

3. The solar cell module of claim 2 wherein the high electric susceptibility layer is the layer of the encapsulant that interfaces with the plurality of solar cells.

4. The solar cell module of claim 1 wherein the high electric susceptibility layer induces a positive sheet charge at an interface of the plurality of solar cells and the high electric susceptibility layer.

5. The solar cell module of claim 1 wherein the high electric susceptibility layer induces a negative sheet charge at an interface of the plurality of solar cells and the high electric susceptibility layer.

6. The solar cell module of claim 1 wherein the high electric susceptibility layer is separate from the encapsulant.

7. The solar cell module of claim 1 wherein the high electric susceptibility layer is polarized by placing the high electric susceptibility material adjacent to a conductive material.

8. A solar cell module comprising:
   a plurality of solar cells, the plurality of solar cells having front sides facing the sun during normal operation and backsides opposite the front sides;
   a protective package that encases the plurality of solar cells; and
   a first high electric susceptibility layer on the front sides of the plurality of solar cells, the first high electric susceptibility layer having an electric susceptibility of at least 100.

9. The solar cell module of claim 8 wherein the protective package comprises a multilayer encapsulant that is between the front sides of the solar cells and a transparent top cover.

10. The solar cell module of claim 9 wherein the multilayer encapsulant comprises the first high electric susceptibility layer, a second high electric susceptibility layer, and a high electrical resistivity layer between the first and second high electric susceptibility layers.

11. The solar cell module of claim 8 wherein the first high electric susceptibility layer is polarized by placing the first high electric susceptibility layer adjacent a conductive material.

12. The solar cell module of claim 8 wherein the protective package comprises an encapsulant that encapsulates the first high electric susceptibility layer and the plurality of solar cells.

13. The solar cell module of claim 8 wherein the high electric susceptibility layer induces a positive sheet charge at an interface of the plurality of solar cells and the high electric susceptibility layer.

14. The solar cell module of claim 8 wherein the high electric susceptibility layer induces a negative sheet charge at an interface of the plurality of solar cells and the high electric susceptibility layer.

15. A solar cell module comprising:
 a solar cell;
 a protective package that encases the solar cell; and
 a first high electric susceptibility layer on a front side of the solar cell, the first high electric susceptibility layer having an electric susceptibility of at least 100 and polarized such that a sheet charge is on a surface of the first high electric susceptibility layer that faces toward the solar cell.

16. The solar cell module of claim 15 wherein the first high electric susceptibility layer is polarized such that the sheet charge on the surface of the first high electric susceptibility layer is positive.

17. The solar cell module of claim 15 wherein the first high electric susceptibility layer is polarized such that the sheet charge on the surface of the first high electric susceptibility layer is negative.

18. The solar cell module of claim 15 wherein the protective package comprises a multilayer encapsulant that is between a transparent top cover and the front side of the solar cell.

19. The solar cell module of claim 18 wherein the multilayer encapsulant comprises the first high electric susceptibility layer, a second high electric susceptibility layer, and a high electrical resistivity layer between the first high electric susceptibility layer and the second high electric susceptibility layer.

20. The solar cell module of claim 15 wherein the solar cell comprises an all back contact solar cell.

* * * * *